United States Patent [19]

Baker et al.

[11] Patent Number: 5,310,592
[45] Date of Patent: May 10, 1994

[54] FIBROUS CERAMIC AEROBRAKE

[75] Inventors: Anna L. Baker; Darryl F. Garrigus, both of Seattle, Wash.

[73] Assignee: The Boeing Company, Seattle, Wash.

[21] Appl. No.: 589,967

[22] Filed: Sep. 28, 1990

Related U.S. Application Data

[63] Continuation-in-part of Ser. No. 527,600, May 23, 1990, abandoned, which is a continuation-in-part of Ser. No. 381,498, Jul. 18, 1989, abandoned, which is a continuation-in-part of Ser. No. 698,496, Feb. 5, 1985, Pat. No. 5,041,321, which is a continuation-in-part of Ser. No. 667,568, Nov. 2, 1984, abandoned.

[51] Int. Cl.⁵ .................................................. B32B 3/12
[52] U.S. Cl. ....................................... 428/117; 244/113; 244/158 A; 244/160
[58] Field of Search ............. 428/117, 288, 698, 116, 428/118, 375, 368; 52/806; 244/113, 158 A, 160

[56] References Cited

U.S. PATENT DOCUMENTS

| | | | |
|---|---|---|---|
| 3,145,000 | 8/1964 | Mackie | 428/116 X |
| 3,270,503 | 9/1966 | Meyer, Jr. | 244/18 A X |
| 3,603,260 | 9/1971 | Johnson | 428/96 X |
| 3,656,317 | 4/1972 | Gray | 428/117 X |
| 3,702,279 | 11/1972 | Ardary et al. | 428/359 X |
| 3,935,060 | 1/1976 | Blome et al. | 264/25 X |
| 4,093,771 | 6/1978 | Goldstein et al. | 428/312.6 |
| 4,112,179 | 9/1978 | Maccalous et al. | 428/325 |
| 4,193,829 | 3/1980 | Kourtides et al. | 428/117 X |
| 4,198,454 | 4/1980 | Norton | 428/117 |
| 4,348,441 | 9/1982 | Kato | 428/49 |
| 4,381,333 | 4/1983 | Stewart et al. | 428/312.6 |
| 4,464,192 | 8/1984 | Layden et al. | 428/902 X |
| 4,472,510 | 9/1984 | January | 428/428 X |
| 4,564,556 | 1/1986 | Lange | 428/143 X |
| 4,605,588 | 8/1986 | Simpson et al. | 428/288 |
| 4,849,276 | 7/1989 | Bendig et al. | 428/117 |
| 4,867,639 | 9/1989 | Strangman | 428/117 X |
| 4,896,847 | 1/1990 | Gertsch | 244/160 X |
| 4,948,662 | 8/1990 | Simpson et al. | 428/375 X |
| 5,000,998 | 3/1991 | Bendig et al. | 156/197 X |
| 5,041,321 | 8/1991 | Bendig | 428/117 X |

*Primary Examiner*—Henry F. Epstein
*Attorney, Agent, or Firm*—John C. Hammar

[57] ABSTRACT

An ablative fibrous ceramic article comprises a honeycomb core having a plurality of cells, fibrous ceramic insulation (including fibers, microballoons, microparticles, or mixtures thereof) at least partially filling each cell of the core and forming a porous sheet on one face of the core, and, optionally, an ablative material infused into a portion of the porous sheet. Such an article is a candidate for fabricating an effective lunar/Martian aerobrake.

16 Claims, 1 Drawing Sheet

FIBROUS CERAMIC AEROBRAKE

REFERENCE TO RELATED APPLICATIONS

The present application is a continuation-in-part application based upon U.S. patent application Ser. No. 07/527,600, filed May 23, 1990 and now abandoned; which is a continuation-in-part application based on U.S. patent application Ser. No. 07/381,498, filed Jul. 18, 1989, now abandoned; which, in turn, is a continuation-in-part application based on U.S. patent application Ser. No. 06/698,496, filed Feb. 5, 1985, now U.S. Pat. No. 5,041,321; which, in turn, is a continuation-in-part application based upon U.S. patent application Ser. No. 06/667,568, filed Nov. 2, 1984, now abandoned.

TECHNICAL FIELD

This invention relates generally to fibrous ceramic aerobrakes, particularly those using ablative materials, and their method of manufacture.

BACKGROUND ART

In aerospace systems, engine exhaust ducts, nose cones, firewalls, and reentry shield surfaces, often are exposed to high temperatures or large temperature gradients and must, accordingly, be insulated. Each application has unique problems which have rendered it difficult to provide an adequate thermal insulation that can be tailored for optimum performance in each application.

Recently, low-density ceramic fibers have been used for insulating aerospace surfaces. For example, the space shuttle's exterior surface is insulated with a plurality of ceramic tiles that are arranged in a closely spaced, ordered array. To provide the required fit, each tile is cut precisely from a fused ceramic blank. To form the blanks, silica fibers and other ceramic components were initially mixed into a slurry and cast into blocks. After drying, the blocks were sintered to form strong ceramic bonds between the overlapping fibers. The blocks were cut into smaller blanks that were subsequently milled into the final tiles. Each tile was bonded to an isolation pad with a high-temperature adhesive. The pad was, then, bonded to the underlying metallic substructure of the shuttle.

During takeoff and reentry, a differential surface temperature distribution exists over the surface of the space shuttle. The fused ceramic tiles are vulnerable to shear forces caused by the differential surface temperature distribution. To prevent breakage, each tile must be small (generally less than ten inches on a side) thereby creating enormous fabrication and assembly costs.

Glass coatings have been developed to improve thermal shock resistance for ceramics. U.S. Pat. No. 4,093,771 to Goldstein et al. discloses a borosilicate glass coating that is used on the surface of reusable silica insulation. U.S. Pat. No. 4,381,333 to Stewart et al. discloses a two-layer glass coating for silica insulation. The base layer has a high emittance and is preferably formed by combining a reactive borosilicate glass with an emittance agent, such as silicon tetraboride, silicon hexaboride, boron, or silicon carbide. The outer layer is formed from discrete, sintered glass particles to provide a high scattering coefficient. Preferably, fused silica or a reactive borosilicate glass having a higher silica content than the base layer is used for the outer layer. In either the Goldstein or Stewart patent, the coating is sprayed onto the underlying fiber insulation and is fired to form a glass.

Insulation may be formed with an unsolidified silica glass felt sandwiched between silica glass fiber cloth. The three layers are stitched together with silica glass thread (or another suitable refractory thread) and are bonded with adhesive to the surface to be protected. Similarly, a layering effect may be achieved by superposing a stitched blanket of silica and aluminoborosilicate fibers (commercially available under the trademark NEXTEL from 3M Company) over a separate, stitched blanket of silica fibers. By staggering the blankets and using suitable emittance coatings on the outer surfaces of the blankets, control of the insulative characteristics can be achieved, thereby countering the temperature distribution on and gradient through the insulation.

Lightweight fibrous insulation that permits a wide range of design choices in terms of insulative characteristics, strength, and durability is still needed, especially insulation that can withstand long exposures to high temperatures as are likely to occur for aerobraking orbital entries for lunar or Mars explorers.

U.S. Pat. No. 4,849,276 to Baker et al. describes a thermal insulation structure comprising a honeycomb core, fibrous ceramic insulation filling portions of the core and extending in a sheet over the core, and a reinforcing glass topcoat. Insulation of this type improves over the silica tiles, by permitting easier assembly of larger areas and active transpiration. Still, tiles of this type are inadequate for long duration exposure to the high temperatures likely to be incurred with aerobraking.

Ablative heat shields have been studied for a long while. These aerobrakes include materials that degrade and slough off when heated. The decomposition, degradation, and falling away of material (i.e. "ablation") is a primary means to dissipate the heat. As the ablation occurs, the aerosurface of the vehicle continues to change and the flight characteristics change as well. Furthermore, the best candidate ablative materials are relatively dense, introducing a severe mass penalty to the vehicle. Because the materials effectively burn off during reentry, the vehicles (or at least the tiles) must be expendable; they cannot be refurbished in an economically practical manner.

Boeing copending U.S. patent application Ser. No. 07/238,957 (incorporated by reference) describes a thermal protection system for a spacecraft that is patterned after a "water wall." Spaced electrodes are used to gel a sol gel within the pores of ceramic fiber insulation using direct current at low voltages and, thereby, to trap a fluid. Heat from the reentry may evaporate the fluid, but the sol can be restored by simply diffusing additional water into the structure. The evaporation provides transpirational cooling for the material. This thermal protection system concept also suffers a relatively severe mass penalty, however, from the high density of the carrier fluid and increased fabrication costs from the added structural complexity of spaced electrodes that are embedded within the fibrous ceramic.

SUMMARY OF THE INVENTION

A fibrous ceramic aerobrake of the present invention generally comprises:
 a honeycomb core having a plurality of cells;
 fiberform (i.e. fibrous) ceramic insulation at least partially filling each cell of the core and forming a porous sheet on one face of the core; and, optionally, an ablative material infused into a portion of the porous sheet.

Preferably the aerobrake uses a graded slurry of ceramic fibers, beginning with relatively inexpensive refractory ceramic fibers within the cells of the honeycomb core and transitioning (abruptly or gradually) to an ultrarefractory layer at the outer edge of the felted sheet. The refractory ceramic fibers (generally NEXTEL 440 aluminoborosilicate fibers or $Al_2O_3-SiO_2$ fibers) and the ultrarefractory layer (generally zirconia, hafnia, ceria, or yttria fibers or mixtures thereof) are rigidly bound with a suitable sol gel binder (particularly an alumina sol) into a low density ceramic insulation generally with the preferred process of Baker U.S. Pat. No. 5,041,321. The ablative material (generally a phenolic resin) is infused within the felted mat, generally within the ultrarefractory layer.

Emissivity agents (particularly particulate or fibrous silicon carbide, boron carbide, or mixtures thereof or ablative agents (such as carbon fibers) can also be included in the fiber slurries and thereby be incorporated into the felted mat. When used in this manner, however, carbon fibers may lead to collapse or disintegration of the insulation, if the carbon fiber loading is not controlled. Therefore, we discourage their use, except for designing aerobrakes to withstand extreme heat loads. Then, use should be controlled to well defined layers to promote sloughing off of portions of the aerobrake.

The low-density fiberform ceramic insulation that we prefer has surprising physical properties and is made by forming a slurry of ceramic fibers, molding the slurry to form a soft felt mat, drying the mat, and incrementally introducing a sol gel glass binder into the mat and curing it to form a rigid mat. The incremental addition of the sol gel binder is preferably accomplished through a unique multiple impregnation technique in which a small amount of binder is initially impregnated into the mat, is gelled, and is cured to stablize the mat dimensionally, allowing handling and further processing of the mat. The mat is strengthened thereafter to its final density by successive additions of glass binder. This technique cures the mat to a rigid, predetermined shape without appreciable shrinking of the resultant structure, and is contrasted with prior processes in which the entire binder is introduced either in one impregnation of the mat or by incorporating the binder in the fiber-containing slurry prior to the molding or felting operation. U.S. Pat. No. 3,702,279 to Ardary et al. and U.S. Pat. No. 3,935,060 to Blome et al. exemplify these prior processes.

By forming a plurality of slurries containing different ceramic fibers, and molding each of the slurries in succession to form a single felted mat having interlocking layers of fibers, the thermal and mechanical characteristics of the resulting insulation can be controlled over a wide range. By using longer fibers, the insulation can be strengthened where desired, as, for example, in the region that is joined to the skin or substructure.

Where a particular application requires further resistance to high temperatures or to large temperature gradients, a layer of high emittance material can be formed at the desired locations within the continuous fiber mat. One or more of the slurries felted to form the mat include an emittance agent, such as boron carbide or silicon carbide, as an additive. A desired insulative profile can also be obtained by using ceramic fibers of different materials in the different slurries, thereby countering the effect of the temperature distribution on the surface. With these controllable variables and others, insulation can be made for a wide range of applications. In the case of an aerobrake, the fiber composition is generally varied from low density refractory ceramic fibers at the core to mixed fibers including zirconia, and, finally, to a pure zirconia fiber cap, thereby forming at least three discrete zones through the thickness of the mat and providing maximum thermal protection at the outer surface.

Zirconia should be understood to be only a representative example of an ultrarefractory material that is suitable for use as the outer layer. Other suitable ultrarefractory materials include hafnia, ceria, yttria, thoria, or the like. Mixtures, of course, might also be used. Throughout this specification, we will typically use zirconia as the exemplative ultrarefractory material. Unless otherwise indicated, in each circumstance, any of the identified ultrarefractory materials could be substituted for zirconia in these examples.

The insulation can be formed with a further coating on its outer surface, preferably by bonding a glass fiber cloth to the ultrarefractory surface, adding powdered glass to the cloth, melting the powder, and solidifying the melt. Such a coating provides impact resistance to the otherwise brittle (friable) fiberform ceramic. For the aerobrake application, however, the glass cap must be fabricated with pores to allow the ablative resin to infuse and to ablate. We generally discourage use of a glass cap for this aerobrake application, because of the complications it adds to the manufacture of the completed article.

A vacuum-felting process tends to align the ceramic fibers parallel to the forming surface, producing an anisotropic material having reduced flatwise tensile strength. This anisotropic material can be mechanically strengthened by stitching the mat with glass or other high-temperature refractory thread in a direction that is normal or at angles to the mat fibers. If the mat has layers, the stitching provides additional connection between the layers. Stitching can also be used to anchor the glass fabric of the coating to the mat. If desired, the lower layers can include microballoons to improve the strength characteristics of the fibrous ceramic. Microparticle enhanced fibrous ceramic insulation is described in our copending U.S. patent application Ser. No. 07/527,600, filed May 28, 1990, which is incorporated by reference. Only the lower layers adjacent the honeycomb core generally include microballoons or microparticles because they tend to reduce the porosity by filling the voids around fibers, thereby slowing infusion of the ablative material and its escape in operation.

The resulting insulation comprises a mat of intersecting ceramic fibers, which are held together by sol gel glass bonds. This insulation usually includes a network of ceramic fibers that are disposed in a plurality of layers, with fibers within each layer intersecting other fibers within the same layer. Some fibers within each layer intersect fibers in adjacent layers. To strengthen the layered network, sol gel glass bonds are formed where the ceramic fibers intersect.

DETAILED DESCRIPTION OF THE INVENTION

Ceramic insulation suitable for reentry vehicles must be resistant to at least three heat transfer regimes. First, it must be able to withstand high absolute temperatures which are caused by friction during take-off and reentry. In some cases, an ionizing cloud may form at the bow (front) of the aerobrake. This cloud radiates energy in the UV range. Second, the insulation must be able to resist large temperature gradients across the insulation caused by a large temperature difference between the interior of the vessel and the environment. Here, the environment either may be hot (sun-side) or cold (shadow) with an aerobrake, of course, controlling the temperature. Third, the insulation must be able to withstand large temperature gradients at different portions of the surface (i.e., lateral gradients) since one portion may be hot while another nearby portion may be cold. The insulation of the present invention fulfills these general goals.

In addition, especially for lunar/Mars missions, ceramic insulation must be able to withstand the extreme temperatures of aerobraking for extended periods without allowing the crew quarters or mechanical components of the vehicle to overheat and without unduly altering the aerodynamic characteristics of the vehicle. We have discovered that conventional solutions geared to reentry to Earth's atmosphere [a brief exposure to temperatures of about 2200° C. (4000° F.)] are inadequate for the duration of exposure and temperatures expected for aerobrake-assisted entry into the Martian atmosphere (or, in some cases, even the lunar atmosphere). Accordingly, in the present invention, we propose a novel ablative fibrous ceramic aerobrake that combines the features of fiberform ceramic insulation discussed in our earlier patents and copending applications with additional improvements needed to obtain the physical properties required for lunar/Martian aerobrakes. In particular, we disclose an ablative insulation comprising a graded fibrous ultrarefractory-refractory ceramic body infused with an ablative (phenolic) resin. This body provides resistance to extreme temperatures and heat loads for extended exposures, such as those contemplated for lunar/Martian aerobraking, while retaining a relatively low composite density.

Figure 1:
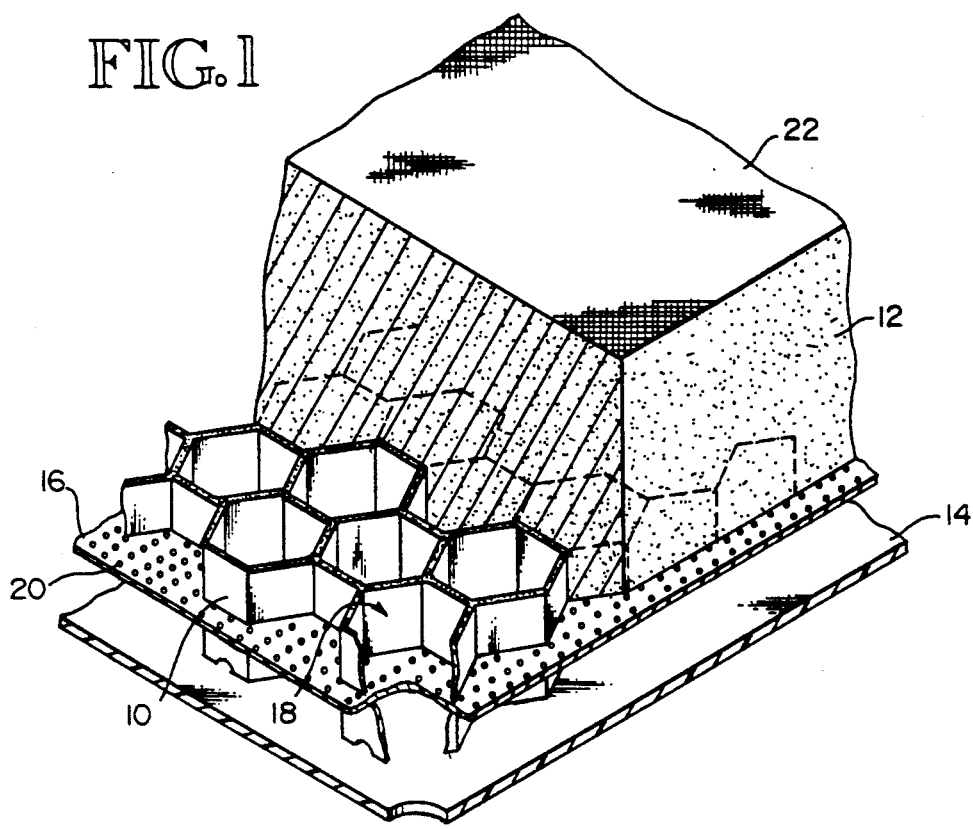
FIG. 1 is an isometric schematic of preferred aerobrake of the present invention.

To form the fibrous ceramic insulation, a felted mat of discrete ceramic fibers that selectively intersect one another in a semi-random fashion is bonded with a sol gel glass binder that forms bonds between the fibers at their intersections. This insulation may be formed in a variety of shapes including flat structures, hollow cylinders, and domes. The insulation may be bonded directly to the surface to be protected or may be formed on a substrate that is subsequently attached to the surface. For example, as described in U.S. Pat. No. 4,849,276, a metal, ceramic, or resinous honeycomb core 10 (FIG. 1) may be used to position a layer of the insulation 12 in spaced relation to an underlying surface 14 to provide thermal protection for the surface 14 through enhanced conductive and convective thermal resistance. A septum 16 within the core 10 may divide each cell 18 into inner and outer cavities. In some cases, the septum is burned out of the cells during regular manufacturing processes for the article, leaving cells partially filled with ceramic insulation. The ceramic insulation 12 fills only the outer cavities. This arrangement is preferably achieved by vacuum casting the insulation 12 into the outer cavities of the honeycomb core 10 by drawing a vacuum through perforations 20 in the septum 16 to draw a slurry of the fibers into the outer cavities of the cells 18. The fibers are then bonded together to form the ceramic insulation 12. Infusion of resin into the fibrous ceramic in the region of the outer surface forms a coating 22 that completes the aerobrake of the present invention.

The honeycomb core structure provides a ready mechanism for incorporation of active cooling, if the application requires it. Coolant can flow to the underside of the fiberform ceramic through the ports in the core. Active cooling, however, is discouraged because of its cost, complexity, and mass penalty.

The honeycomb core generally includes a textured edge (as described in our copending applications) to improve the connection between the core and the ceramic composite and to reduce the strain that otherwise might occur from differences in the coefficients of thermal expansion for the core materials (generally metal) and the ceramic insulation.

With a sol gel glass binder in a ceramic fiber mat, gelling of the binder at the junctions of the intersecting fibers ordinarily shrinks the mat. Some degree of shrinkage can be tolerated where the formed insulation mat is machined into the final configuration, as in prior art processes. Where the ceramic fiber is to be formed in situ, such as in honeycomb, however, shrinkage is more critical and, often, cannot be tolerated. The multiple impregnation technique of the present invention controls the shrinkage of the ceramic fiber mat and is optimally suited for use where such control is essential.

An aqueous slurry of ceramic fibers is thoroughly mixed to provide a substantially uniform dispersion of the fibers. The slurry generally comprises from about 0.2–0.5 weight percent fibers and from about 99.5–99.8 weight percent water. Suitable refractory ceramic fibers include those made from silica, alumina, mullite (commercially available under the trademark ULTRAFIBER 440 from 3M Company), silicon nitride, aluminosilicate, aluminoborosilicate, zirconia, hafnia, ceria, yttria, thoria, or mixtures thereof. Different concentrations may be used, as desired. It may be desirable to use fibers of different materials to form layers in the composite or to form a graded material to tailor the insulative characteristics or density of the insulation. For instance, a mat having distinct layers of aluminoborosilicate fibers and overlying zirconia fibers would be more useful at higher temperatures than aluminoborosilicate alone. Fibers of mullite or of an alumina-zirconia mixture would reduce the density of the resulting insulation without substantially affecting the temperature limit for the insulation.

In the present invention, we prefer to fill the cells of the honeycomb 10 with fibers (or microparticles) that have high use temperatures but that are generally cheaper than ultrarefractory fibers. Then, we complete the composite by grading the insulation (or stepping it abruptly, if preferred) to 100% zirconia or other ultrarefractory fibers in a layer adjacent the outer edge. Zirconia, hafnia, ceria, yttria, and thoria fibers possess the highest thermal resistance that we can identify (while having a reasonable density), and we pursue this quality in the materials that we use. Thoria has the highest use temperature for the refractory oxides.

Ultrarefractory fibers might be used throughout the aerobrake, but they would increase the overall cost and might not provide any better performance than is achievable with a graded material. We have found surprisingly good results with a graded aluminosilicate silica-zirconia composite, as will be discussed in greater detail in the examples, and we prefer these graded products.

The length and diameter of the fibers effects the characteristics of the insulation. Generally, the length of the fibers should be between about one-sixteenth and four inches, while the diameter of the fibers should range between about one and ten micrometers, and, preferably, 1-3 micrometers. Shorter fibers can be used with conventional cellulose fiber-felting aids. The preferred fibers are about one-quarter inch in length and about one micron in diameter.

The binder is preferably an alumina sol gel glass that can be prepared using conventional techniques as we describe in our earlier applications. Other sol gel glasses may be used, particularly a zirconia sol gel of similar composition to the particular fiber in the mat, if desired.

After the slurry has been thoroughly mixed, it is pulled by vacuum through a filtered mold to form a soft felt mat on the mold. Through selection of the mold, the felt mat can be formed in a variety of shapes, including those with irregular, curved surfaces and those with open interiors, such as hollow cylinders.

The soft felt mat, usually without the mold, is heated to a temperature of about 200° F. (93° C.) to remove all water from the mat. The best green strength for the dried mat is obtained when the majority of fibers are about one-quarter inch in length and about one micron in diameter. The duration of drying will, of course, depend upon the size and shape of the mat.

Once the felted mat has been dried, it is solidified or cemented using a sol gel glass binder that preferably is introduced in incremental stages. This incremental addition of binder limits shrinkage of the mat and assures good distribution of the binder throughout the mat. Surprisingly higher densities and greater strength for the insulation results. Incremental addition of the binder involves repeating the steps of impregnating the mat with binder, gelling the binder, and curing the mat and binder. Preferably, a light coating of binder is applied in the first stage with an air-dry gellation to stablize the fiber mat dimensionally. Thereafter, the steps of impregnating, gelling, and curing are repeated one or more times until the total binder is added. The density and strength of the resulting insulation can be controlled with this multiple binder impregnation technique. Because the configuration of the felted fiber mat is maintained precisely, the process is particularly suited to applications where shrinkage of the mat is a prime concern. Precise parts in varied shapes are achievable without further machining.

The impregnating step may be accomplished by wicking, spraying, or vacuum infiltrating (i.e. suction).

After impregnation, the binder is converted to a rigid gel, usually by air drying, by subjecting the binder-impregnated mat to an atmosphere of ammonia gas, or by exposing the gel to a low power direct current. Since the ammonia sol reaction is exothermic, there is a tendency for bubbles to form in the mat if ammonia is used. This problem is avoided, however, by gelling the first binder in air. Thereafter, trapped bubbles are not a problem, and ammonia gellation can be used.

After gelling the binder, the mat is cured, first, by heating the mat to about 200° F. for about four hours, then, by slowly increasing the temperature to about 600° F. over a five-hour period, and, finally, by rapidly reducing the temperature (quenching).

Figure 2:
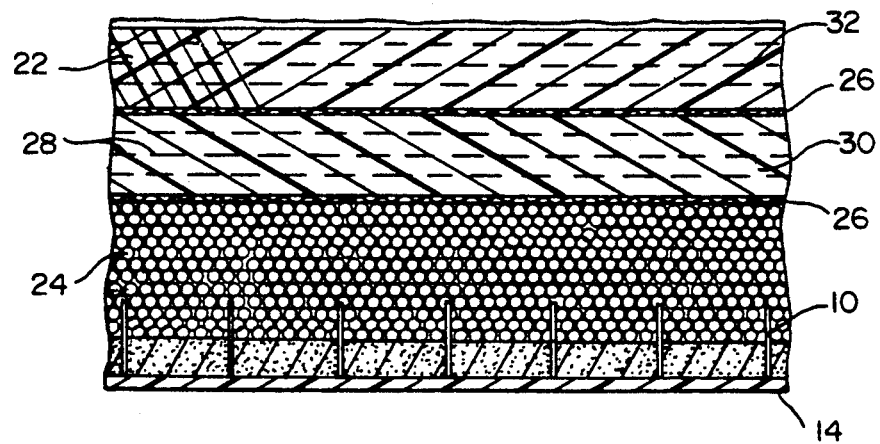
FIG. 2 is a cross-sectional schematic of another preferred article of the present invention.

As described earlier (and, more thoroughly, in our copending application Ser. No. 07/527,600) the fibrous ceramic insulation of the present invention can also include microparticles 24 (FIG. 2) in combination with or as a replacement for the fibers. By micro particles, we generally mean microballons, spheres, or diatoms. Glass microballoons are commercially available in many sizes and are generally hollow spheres made from various types of glass compositions with various wall thicknesses, usually in the size of about 5 to 200 microns in diameter. Solid spheres may also be used in place of or in addition to hollow microballoons. As for the fibers, the size of the microballoons will in part determine the mechanical strength and physical characteristics of the resulting composite. Preferably, the microballoons should be in a range of about 5 to 50 microns, which appears to be the preferred size for filling the voids which would otherwise exist between the fibers, thus increasing the strength. Because the microparticles fill the voids, we prefer to use them, if at all, in the portion of the insulation that is not infused with resin. That is, we prefer to use the microparticles, if at all, in the portion of the insulation adjacent to or within the honeycomb. The concentration of the microballoon slurry is not believed to be particularly critical but, for convenience, the slurry will generally comprise up to 10 wt % fibers, up to 10 wt % microballoons and/or diatoms (based on the total weight of the slurry) with the remainder being water. The slurry may contain from 0-99 wt % of ceramic fibers and from 1-100 wt % microparticles, based on the combined dry weight of fibers and microparticles. In some cases the composite may consist entirely of microparticles (i.e. be free of fibers).

Processing with microparticles to form ceramic composites is otherwise the same as with fibers.

To form an impact-resistant coating on the outer surface of the felted and bound mat, a aluminoborosilicate glass fiber cloth (NEXTEL), having a boron nitride barrier coating of the type described in U.S. Pat. Nos. 4,605,588 and 4,948,662 to Simpson and Verzemnieks, may be used in conjunction with a powdered borosilicate glass (PYREX). According to the method of Simpson and Verzemnieks, the barrier coated glass cloth preferably is formed by heating the cloth in a nitriding atmosphere, including ammonia, at a temperature of between about 2200° F.-2500° F. for about 5-90 minutes or longer. Hydrogen and nitrogen may be added to dilute the ammonia. Preferably, the flowing atmosphere has about 11% $H_2$, 5% $NH_3$, and 84% $N_2$ by volume. Boron nitride forms as a barrier coating on the NEXTEL fiber. When incorporated into the glass coating the resulting composite has superior impact resistance and strength. The barrier coating provides incomplete bonding of the glass to the cloth so that the composite can better absorb the energy of growing cracks, thereby stopping their growth. Other glass fabrics and powdered glasses, preferably thermal shock-resistant glasses, may be used, the selection being determined by the particular application for the insulation. Coating the fiber mat should be accomplished without fusing the individual fibers in the fabric. While a sol gel reaction may be used for binding the fabric, the powdered glass technique is preferred. The glass coating, however, should be designed to be porous (i.e. to include passageways to the felted mat).

The fibrous ceramic insulation can be made with the fiber reinforced glass top coat by initially placing the glass fiber cloth for the impact coating in the vacuum mold used for forming and shaping the ceramic fiber mat so that the ceramic fibers will interlock with the pores of the cloth. Since the cloth is porous, it will not significantly impede passage of the sol gel binder into the mat. Thus, the incremental processing steps to add the binder can be followed, and the resulting insulation can have the glass fiber cloth reinforcement directly on the mat.

The mechanical strength of the insulation may be further enhanced by stitching the fiber mat with a suitable refractory thread. Since the vacuum-forming procedure tends to align the ceramic fibers parallel to the forming surface, the threads can be sewn in a pattern which orients the stitches in a predetermined direction to the fiber orientation. In the same way, the glass fiber cloth of the coating may be stitched to the mat, with the stitching preferably being done after initial addition and curing of the sol gel glass binder so that the mat is dimensionally stablized.

If a glass topcoat is used (and we do not recommend it), the topcoat must be formed to include openings to permit the resin to infuse into the fibrous ceramic and to transpire out when the resin ablates during use. We are concerned that the topcoat will reduce the benefit gained with the ablative material, so we generally do not use this strengthening technique.

In accordance with the technique described in co-pending U.S. patent application Ser. No. 07/537,339 to Garrigus (incorporated by reference), the insulation may be reinforced in layers or regions throughout its thickness, without introducing the potential difficulties of a glass topcoat, by incorporating ceramic fabric 26 (FIG. 2) into intermediate layers of the fiber mat. For example, fabric reinforcement (in woven or tow form) may be bound within the fibrous felt mat with sol gel glass bonds. Composites reinforced in this way have improved internal strength and may be felted to greater thicknesses, as may be desirable or required for the aerobrake of the present invention.

After felting a portion of the slurry, the mat may be strengthened at the exposed surface using the Garrigus method by weaving a ceramic or glass thread into the mat to provide a relatively even surface for applying the reinforcing cloth. Then, the ceramic cloth is applied over the mat and, if desired, woven into the mat again using ceramic thread. The weaving may or may not be necessary depending upon the ultimate use of the ceramic composites and the strength desired. For example, if the ceramic composite is not intended to be exposed to severe mechanical stresses, then the weaving of the cloth to the mat may not be unnecessary. More of the fiber slurry (optionally containing microparticles) is applied over the ceramic cloth to form a fiber mat over the cloth, thereby forming a sandwich of the fiber cloth between two fiber mats. Sequential applications of felted fibers and reinforcing cloth can be repeated, as desired.

In prior fibrous ceramic insulation where a binder was used to hold the fibers together, the resultant structure was substantially homogeneous throughout. To improve the physical, thermal, and optical properties of these prior art insulation structures, it has been necessary to apply glass coatings to the outer surface of the insulation. For example, U.S. Pat. Nos. 4,381,333 and 4,093,771 use additives to increase the emittance of these glass coatings. While these coatings exhibit satisfactory performance in many applications, it would be advantageous if control over the thermal, mechanical, and other characteristics of the insulation could be provided within the fibrous ceramic mat itself rather than only in an overlay coating, especially for the demanding requirements of aerobrakes. The fibrous insulation of the present invention satisfies this aim by including a layering technique, which permits formation of a continuous fiber structure having layers that impart distinct characteristics at desired regions within the structure. Slurries of different characteristics are applied at the desired locations to produce a felt mat having interlocking layers. The types of fibers, the physical dimensions of the fibers, the number of layers, and the slurry additives can be varied to achieve a continuous mat having the desired distribution of properties.

In this regard, the slurry can be modified to produce an article that is modified throughout its thickness or in discrete locations laterally to include emissivity or ablative agents. For a reusable aerobrake, only an emissivity agent should be used since the ablative agent, buried within the structure of the felt, will weaken in use (i.e. decompose) and the structure will eventually collapse.

A suitable emissivity agent 28 (FIG. 2) is silicon carbide or boron carbide. We prefer SiC in particulate, fiber, or whisker form. It functions as a superior radiator of heat. Typically, about 3 wt. % of the emissivity agent is added to the slurry during felting of the outer portion of the felted body.

A suitable ablative agent for addition to the slurry comprises carbon fibers or other organic resinous fibers. Carbon fibers are preferred. Ablative agents of this type in the slurry are only contemplated for the most hostile conditions where changing the aerosurface must be sacrified to save the vehicle. The fibers will ablate slowly under the intense heat. If incorporated in a sufficient amount, the felted body will deteriorate and the outer portion will slough off. Therefore, if ablative agents are used, we recommend that they be incorporated into layers within the felted body preventing the loss of the entire insulation. Sloughing off of insulation caused by the decomposition of the ablative fibers provides significant cooling although the aerosurface of the vehicle changes significantly and flight characteristics change, accordingly. To provide controlled sloughing, the insulation must be prepared carefully to ensure that the degradation is uniform (i.e., the entire surface sloughs off at about the same time). Design is a significant engineering task. Therefore, we recommend ablative fibers only for the most extreme conditions where no other viable solutions exist. It is wise to design the insulation to have a resin-filled zirconia (ultrarefractory layer) immediately under the ablative fiber layer to provide necessary insulation after the outer layers slough off. Sloughing off carries away intensely heated portions of the aerobrake and, thereby, increases the length of time that the vehicle can be exposed to such temperatures. The underlying structure will be relatively cool after sloughing off, but it will heat rapidly. The innermost region of the felted body should be free of ablative fibers. Carbon fibers are preferred as ablative fibers, because they have a much longer life expectancy. They degrade only in the most severe conditions.

If desired, of course, both emissivity and ablative agents can be used in the slurry at the same time. Again, the conditions of the intended mission will dictate the precise design of the final composite, as will be understood by those of ordinary skill in the art.

Improved properties can be obtained by curing the sol gel binder in an ammonia or other nitrogen-containing gas atmosphere so that nitrogen replaces oxygen in the glass structure. Such a substitution results in enhanced fracture toughness, microhardness, refractoriness, and chemical durability. As explained by Brinker and Haaland for oxynitride glasses (J. of Am. Ceramic S., vol. 66, No. 11, p.758–765), nitrogen can interact with oxygen in the glass through hydrogen bonding, can interact with metals in the glass through Lewis acid adsorption, and can replace oxygen entirely through well-known chemical reactions at the surface. In this way, the 3-fold coordination of nitrogen can be introduced into the glass matrix to replace the 2-fold coordination of oxygen, and improves the glass. Nitrogen serves as a crosslinking agent which should increase the glass transition temperature. The microhardness should be increased as well as the sintering temperature, and the thermal expansion characteristics will probably be altered.

Once the fibrous ceramic insulation is felted, stabilized, and bound, an ablative resin 22, such as SCI008 available from the Borden Company any other conventional phenolic resin, can be infused into the outer surface to form a resin-filled portion of the completed composite. The resin should have a reasonable viscosity at working temperature to promote its infusion by capillary action, but should be sufficiently stable and temperature resistant to function as an effective ablative material. We prefer to use an ablator with a high char yield.

Density of the final product is an important consideration. Accordingly, the amount of resin used becomes a trade between the density and the cooling/insulating requirements. Again, the intended mission will dictate the selection of the best resin and its quantity.

The following actual and hypothetical Examples illustrate preferred features of the invention.

EXAMPLE I

A fiber slurry of 60 gallons of water and 300 grams of aluminosilicate fibers approximately 0.25 inches in length and one micron in diameter was mixed by circulating the components for 30 minutes through a polyethylene-lined, air-operated, double-diaphragm pump into a 90-gallon polyethylene tank. A filter mold was attached to the pump, and 30 gallons of slurry (about ½ the volume) were pulled through the mold, depositing about 150 grams of fiber in a soft mat on the surface of the mold. The mat was removed from the mold and was dried in a circulating-air oven at about 200° F. until all the water was removed.

An alumina sol-gel binder comprising about 459 grams of aluminum isopropoxide, 4053 grams of distilled water, and 18 grams of hydrochloric acid was refluxed at a controlled temperature for three days, and was, then, distilled to a solution containing seven grams of alumina per 100 cc.

The resulting sol was wicked into the dried fiber mat until the entire mat was saturated. To convert the sol to a gel, the saturated mat was placed in a sealed nylon bag with an outlet tube that was connected to a bottle of ammonia gas. The bag was inflated with gas at flow rate designed to keep the bag fully expanded. After one hour, the gas was turned off and the bag was opened, allowing the excess gas to escape. The fully gelled mat was removed from the bag, and cured for four hours in an air-circulating oven at about 200° F. After is initial four-hour period, the temperature was slowly increased to 600° F. over a five-hour period, before the temperature was rapidly lowered to 200° F. and maintained at 200° F. for two more hours. The resulting rigid mat had a density of 16 lb/ft$^3$ and a flexural strength of 200 psi.

A sheet of NEXTEL glass fiber cloth was cut to the size of the mat. The surface of the rigid mat was lightly wetted with the alumina sol gel binder. The cloth, saturated with this binder, was placed on the surface of the mat. A slurry containing 100 grams of $-325$ mesh borosilicate glass powder and 50 grams distilled water was then brushed onto the cloth. The resulting composite assembly was then heated in an air-circulating oven at 200° F. until dried. The dried assembly was then heated for five minutes at 2000° F. to melt the borosilicate glass, before being removed from the oven to cool and solidify the glass.

EXAMPLE II

The process of Example I was followed to form a rigid mat, except that, after the fully gelled mat was cured, the impregnating, gelling, and curing steps were repeated by (1) resaturating the mat in two successive applications with the alumina sol binder, (2) exposing the saturated mat to ammonia gas for one hour, and (3) then, heating the mat with the same temperature regime as Example I to cure the second addition of binder. The mat had a density of 22 lb/ft$^3$ and a flexural strength of 1200 psi, showing the surprising results achieved through incremental binding method of the present invention. The flexural strength increased six-fold by the incremental binding technique.

EXAMPLE III

Four slurries were prepared in the manner described in Example I. Slurry A had no additional ingredients. Slurries B, C, and D included about the following amounts of silicon carbide fibers (an emissivity agent): 0.5 g for slurry B; 1.0 g for slurry C; and 3.0 g for slurry D. These four slurries were then molded into a soft felt mat using a filter mold attached to the pump. A first layer was laid down on the mold using 30 gallons of slurry A, depositing a 150-gram soft mat on the mold surface. Successive layers from slurries B, C, and D were deposited on the underlying layers. The resulting mat had a total weight of about 600 grams. This mat was then processed in an identical fashion to Example 1, but without the addition of the glass coating. Through proper molding, different areas of the slurries could be coated at desired locations in the mat.

EXAMPLE IV

A cylindrical filter mold was used to form insulation from a slurry prepared in the same manner as the slurry of Example I. An open cylindrical soft fiber mat 2¼ inch by 3 i inch by 3-inch height was formed and subsequently processed with three incremental additions of binder in the same manner described in Example II. A glass coating having a fiber cloth reinforcement was applied to the inner surface of the rigid mat following the procedure described in Example I.

EXAMPLE V

A slurry was prepared according to the method of Example I, and contained 750 g of zirconia fiber and 40 g of microcellulose fiber (a felting aid). Following the method of Example I, insulation was prepared, using three impregnations of alumina sol gel binder. The product had a density of 36 lb/ft$^3$ and a flexural strength of about 314 psi.

EXAMPLE VI

A slurry was prepared according to the method of Example I, and contained a sufficient amount of ULTRAFIBER 440, a mullite fiber available from 3M Co. After rigidifying in accordance with the method of Example I, using three impregnations of alumina sol gel binder, the product had a density of about 19 lb/ft$^3$.

EXAMPLE VII

A thermal insulation structure of the type described in U.S. Pat. No. 4,849,276 (incorporated by reference) can be prepared using a metal honeycomb core and two slurries of ceramic fibers. First, a slurry of NEXTEL 440 aluminoborosilicate fibers is felted into the core under vacuum suction to form a mat that projected in a sheet over the upper surface of the core. Second, the fibrous ceramic is completed by laying down an outer layer atop the NEXTEL felted body using a slurry of zirconia fibers. The structure is completed by infusing an alumina sol-gel binder into the fibrous ceramic bodies, curing the binder in accordance with the curing processes discussed in our copending applications, and infusing SCI008 phenolic resin into the rigidified fibrous ceramic.

EXAMPLE VIII

The method described in Example VII is followed except that silicon carbide is added to the zirconia slurry to act as an emissivity agent in this outer fibrous ceramic layer.

EXAMPLE IX

The method described in Example VII is followed except that silicon carbide is added to both the NEXTEL and zirconia slurries.

EXAMPLE X

The method described in Example VII is followed, except that three slurries are used and ceramic fiber reinforcement was introduced into the felted mat. The first slurry comprised aluminoborosilicate fibers and it is used to fill the cell cavities and to form a sheet over the top of the honeycomb core. After felting this first portion 24 (FIG. 2), an aluminoborosilicate ceramic fabric 26 is incorporated into the article using the Garrigus method. Then, the second slurry, a 50-50 mixture by weight of aluminoborosilicate and zirconia fibers, is used to deposit a second felted mat 30. Following felting of this mixed ceramic mat 30, the insulation is completed by felting out a zirconia layer 32 using a slurry comprising 100% zirconia fibers, by densifying the "layered" felted body with an alumina sol gel binder, and by infusing a phenolic (ablative) resin into at least the outermost layer 32 of the felted body.

EXAMPLE XI

The method described in Example X is followed except aluminoborosilicate microballoons (FIG. 2) are substituted for the fibers.

EXAMPLE XII

The method described in Example XI is followed except that the first slurry comprises a mixture of aluminoborosilicate fibers and aluminoborosilicate microballoons.

EXAMPLE XIII

The method described in Example X is followed except that SiC particles 28 (about 10% by wt. based on the dry weight of the fibers in the slurries) are added to the second and third slurries as an emissivity agent.

EXAMPLE XIV

A felted ceramic insulation is formed by the method of Example X except that the second slurry includes an effective amount of carbon fibers as an ablative agent within the structure of the body.

TEST RESULTS

The following properties of the composites of the present invention have been measured:

A zirconia fiber felted body was formed and densified using a sol gel binder. Phenolic resin (SC1008) was infused into the mat to saturation. The body withstood three (3) minutes exposure to the 5000+° F. flame of oxyacetylene torch without any apparent degradation (other than ablation of the resin).

A layered, honeycomb composite was prepared using $Al_2O_3$-$SiO_2$ fibers bound with an alumina sol gel binder filling the honeycomb core and covered with a layer of resin-saturated zirconia fibrous ceramic insulation. The honeycomb composite exhibited the following properties:

Composite Density: 55-60 lb/ft$^3$
 (The layers have the following ranges for density:
 $ZrO_2$—36-38 lb/ft$^3$
 $Al_2O_3$-$SiO_2$—16-23 lb/ft$^3$
 honeycomb—2-10 lb/ft$^3$.)
Tensile strength (std. method)
 $ZrO_2$—215 psi@38 lb/ft$^3$
 $Al_2O_3$-$SiO_2$—148 psi@18 lb/ft$^3$
Thermal Conductivity
 $ZrO_2$—0.19 WM$^{-1}$C$^{-1}$@1000° C.
 $Al_2O_2$-$SiO_2$—0.22 WM$^{-1}$C$^{-1}$@1000° C.

Those skilled in the art will understand that the present invention provides a highly flexible approach to the formation of lightweight insulating structures that are suitable for use, particularly as aerobrakes, at high temperature and with large temperature gradients. Since the multiple binder impregnation approach controls shrinkage during the forming process, the invention provides a means for precisely forming ceramic insulation. The product can a variety of configurations. Those skilled in the art will also understand that other ceramic fibers, sol-gel binders, and emittance agents may be used in the process of the present invention. For example, silica, zirconia, hafnia, ceria, yttria, thoria, mullite, or aluminosilicate chromia fibers or mixtures of fibers may be used. Any inorganic material that can be converted from a sol to a glass may be used as the binder. For example, the binder might be a zirconia sol.

Other embodiments of the invention will also be apparent to those skilled in the art from a consideration of this specification. The specification and examples are illustrative only, and the true scope and spirit of the invention is indicated by the claims. Therefore, the invention should be limited only as is necessary by construing the claims in light of this description and the pertinent prior art.

We claim:

1. An ablative fibrous ceramic article comprising:

a honeycomb core having a plurality of cells;

fiberform ceramic insulation at least partially filling each cell of the core and forming a porous sheet having an outer edge covering one face of the core; and an ablative material infused into a portion of the porous sheet.

2. The ceramic article of claim 1 wherein the insulation includes microparticles.

3. The article of claim 1 wherein the insulation is ceramic microparticles, microballoons, whiskers, fibers, or mixtures thereof.

4. The article of claim 1 wherein the insulation includes an emissivity agent.

5. The article of claim 1 wherein the insulation includes an intermediate ceramic fabric reinforcement.

6. The article of claim 1 wherein the insulation is selected from the group consisting of:
   (a) ceramic fibers or microballoons, and
   (b) ablative particles or fibers.

7. The article of claim 1 further comprising a ceramic sol gel binder within the insulation.

8. The article of claim 7 wherein the sol gel binder contains alumina.

9. The article of claim 1 formed into an aerobrake.

10. A fibrous ceramic article comprising: a honeycomb core having a plurality of cells; fiberform ceramic insulation at least partially filling each cell of the core and forming a porous sheet covering the core on one face, and having an outer edge, the insulation comprising at least two different ceramic materials graded in composition across the thickness of the insulation; and, optionally an ablative material infused into a portion of the porous sheet.

11. The article of claim 10 wherein the different ceramic materials are at least one refractory ceramic and at least one ultrarefractory ceramic at the outer edge of the porous sheet.

12. The article of claim 11 wherein the ultrarefractory ceramic includes zirconia.

13. The article of claim 12 further comprising a ceramic sol gel binder within the insulation.

14. The article of claim 13 wherein the binder is applied in a series of infusions and cures and wherein at least the first cure occurs after gelling the binder with ammonia.

15. The article of claim 13 further comprising an emissivity agent incorporated into the zirconia portion of the insulation.

16. The article of claim 10 formed into an aerobrake.

* * * * *